(12) United States Patent
Colosimo et al.

(10) Patent No.: US 10,193,008 B2
(45) Date of Patent: Jan. 29, 2019

(54) LIGHTER THAN AIR VEHICLE

(71) Applicant: BAE SYSTEMS PLC, London (GB)

(72) Inventors: Nicholas Giacomo Robert Colosimo, Preston (GB); Julian David Wright, Preston (GB); Andrew James Williams, Chelmsford (GB)

(73) Assignee: BAE Systems Plc, London (GB)

( * ) Notice: Subject to any disclaimer, the term of this patent is extended or adjusted under 35 U.S.C. 154(b) by 0 days.

(21) Appl. No.: 15/745,802

(22) PCT Filed: Jul. 21, 2016

(86) PCT No.: PCT/GB2016/052203
§ 371 (c)(1),
(2) Date: Jan. 18, 2018

(87) PCT Pub. No.: WO2017/017410
PCT Pub. Date: Feb. 2, 2017

(65) Prior Publication Data
US 2018/0219117 A1  Aug. 2, 2018

(30) Foreign Application Priority Data

Jul. 24, 2015 (GB) .................................. 1513055.2
Jul. 27, 2015 (EP) .................................. 15275177

(51) Int. Cl.
*H01L 31/054* (2014.01)
*B64B 1/14* (2006.01)
(Continued)

(52) U.S. Cl.
CPC ............ *H01L 31/0547* (2014.12); *B64B 1/14* (2013.01); *G02B 26/0825* (2013.01);
(Continued)

(58) Field of Classification Search
CPC .... B64B 1/00; B64B 1/14; B64B 1/40; B64B 1/58; H02S 10/00; H02S 10/40;
(Continued)

(56) References Cited

U.S. PATENT DOCUMENTS 1,290,979 A    1/1919  Griffith
3,220,004 A *  11/1965 Gillespie, Jr. ............ B64G 1/22
                                                     156/165

(Continued)

FOREIGN PATENT DOCUMENTS

DE    20212239 U1    2/2003
EP    2487909 A1     8/2012
(Continued)

OTHER PUBLICATIONS

International Search Report and Written Opinion of International Application No. PCT/GB2016/052204, dated Oct. 13, 2016, 11 pages.

(Continued)

*Primary Examiner* — Joseph W Sanderson
(74) *Attorney, Agent, or Firm* — Maine Cernota & Rardin

(57) ABSTRACT

Disclosed is a lighter than air vehicle comprising: an envelope containing a lighter than air gas, at least part of the envelope admitting the passage of light through the at least part of the envelope; and a directing device for selectively redirecting the light which passes through the at least part of the envelope. The vehicle may further comprises a plurality of devices for using incident light. The directing device for selectively redirecting the light may be for selectively redirecting the light onto a selected device, for example, by switching the positions of two or more devices into the path of the light.

11 Claims, 5 Drawing Sheets

(51) Int. Cl.
  *H01L 31/052* (2014.01)
  *H02S 10/40* (2014.01)
  *G02B 26/08* (2006.01)
  *G02B 7/183* (2006.01)
  *G02B 3/12* (2006.01)
  *F24S 20/80* (2018.01)

(52) U.S. Cl.
  CPC ........ *H01L 31/052* (2013.01); *H01L 31/0521* (2013.01); *H02S 10/40* (2014.12); *F24S 20/80* (2018.05); *G02B 3/12* (2013.01); *G02B 7/183* (2013.01); *Y02E 10/52* (2013.01)

(58) Field of Classification Search
  CPC ..... H02S 20/00; H01L 31/042; H01L 31/054; H01L 31/0547; F24S 20/80
  See application file for complete search history.

(56) References Cited

U.S. PATENT DOCUMENTS

| | | | |
|---|---|---|---|
| 3,620,485 A * | 11/1971 | Gelhard | B64B 1/00 244/125 |
| 5,071,090 A | 12/1991 | Takahashi | |
| 6,371,409 B1 * | 4/2002 | Steele | B64B 1/00 136/292 |
| 8,814,084 B2 * | 8/2014 | Shenhar | A63H 27/10 244/97 |
| 8,833,696 B1 | 9/2014 | Teller et al. | |
| 9,246,433 B2 * | 1/2016 | Goldstein | H01L 31/042 |
| 9,650,122 B2 * | 5/2017 | Chessel | B64B 1/40 |
| 9,694,894 B2 * | 7/2017 | Deakin | B64B 1/08 |
| 10,008,978 B2 * | 6/2018 | Nicklas | H02S 40/22 |
| 2006/0033674 A1 | 2/2006 | Essig, Jr. et al. | |
| 2008/0053094 A1 * | 3/2008 | Palmer | F03G 6/065 60/641.8 |
| 2009/0301546 A1 * | 12/2009 | Sinsabaugh | B64B 1/14 136/246 |
| 2010/0186733 A1 * | 7/2010 | Hoefler | F24S 23/715 126/625 |
| 2013/0062457 A1 * | 3/2013 | Deakin | B64B 1/08 244/25 |
| 2013/0062458 A1 * | 3/2013 | Shenhar | A63H 27/10 244/31 |
| 2013/0126668 A1 * | 5/2013 | Chessel | B64B 1/40 244/31 |
| 2014/0339356 A1 | 11/2014 | Deakin | |
| 2015/0053255 A1 * | 2/2015 | Goldstein | H01L 31/042 136/246 |
| 2016/0301359 A1 * | 10/2016 | Gerritsen | H01L 31/0684 |
| 2017/0019055 A1 * | 1/2017 | Boulanger | H01L 31/046 |

FOREIGN PATENT DOCUMENTS

| | | |
|---|---|---|
| EP | 2597031 A1 | 5/2013 |
| FR | 2320229 A1 | 3/1977 |
| GB | 1253057 A | 11/1971 |
| RU | 2126342 C1 | 2/1999 |
| RU | 2197409 C2 | 1/2003 |
| SU | 1740249 A1 | 6/1992 |
| WO | 9429171 A1 | 12/1994 |
| WO | 2011117619 A2 | 9/2011 |
| WO | 2011148373 A1 | 12/2011 |
| WO | 2013173196 A1 | 11/2013 |
| WO | 2014028201 A2 | 2/2014 |
| WO | 2015091689 A1 | 6/2015 |

OTHER PUBLICATIONS

Search Report under Section 17(5) of Great Britain Application No. GB1513056.0, dated Jan. 25, 2016, 5 pages.
Combined Search and Examination Report under Sections 17 and 18(3) of Great Britain Application No. GB1612620.3, dated Jan. 11, 2017, 7 pages.
Extended European Search Report of European Application No. EP15275178.0, dated Jan. 27, 2016, 6 pages.
International Search Report and Written Opinion of International Application No. PCT/GB2016/052203, dated Oct. 13, 2016, 13 pages.
Search Report under Section 17(5) of Great Britain Application No. GB1513055.2, dated Jan. 21, 2016, 4 pages.
Extended European Search Report of European Application No. EP15275177.2, dated Jan. 27, 2016, 7 pages.
International Preliminary Report on Patentability of International Application No. PCT/GB2016/052203, dated Jan. 30, 2018, 7 pages.
International Preliminary Report on Patentability of International Application No. PCT/GB2016/052204, dated Jan. 30, 2018, 7 pages.

* cited by examiner

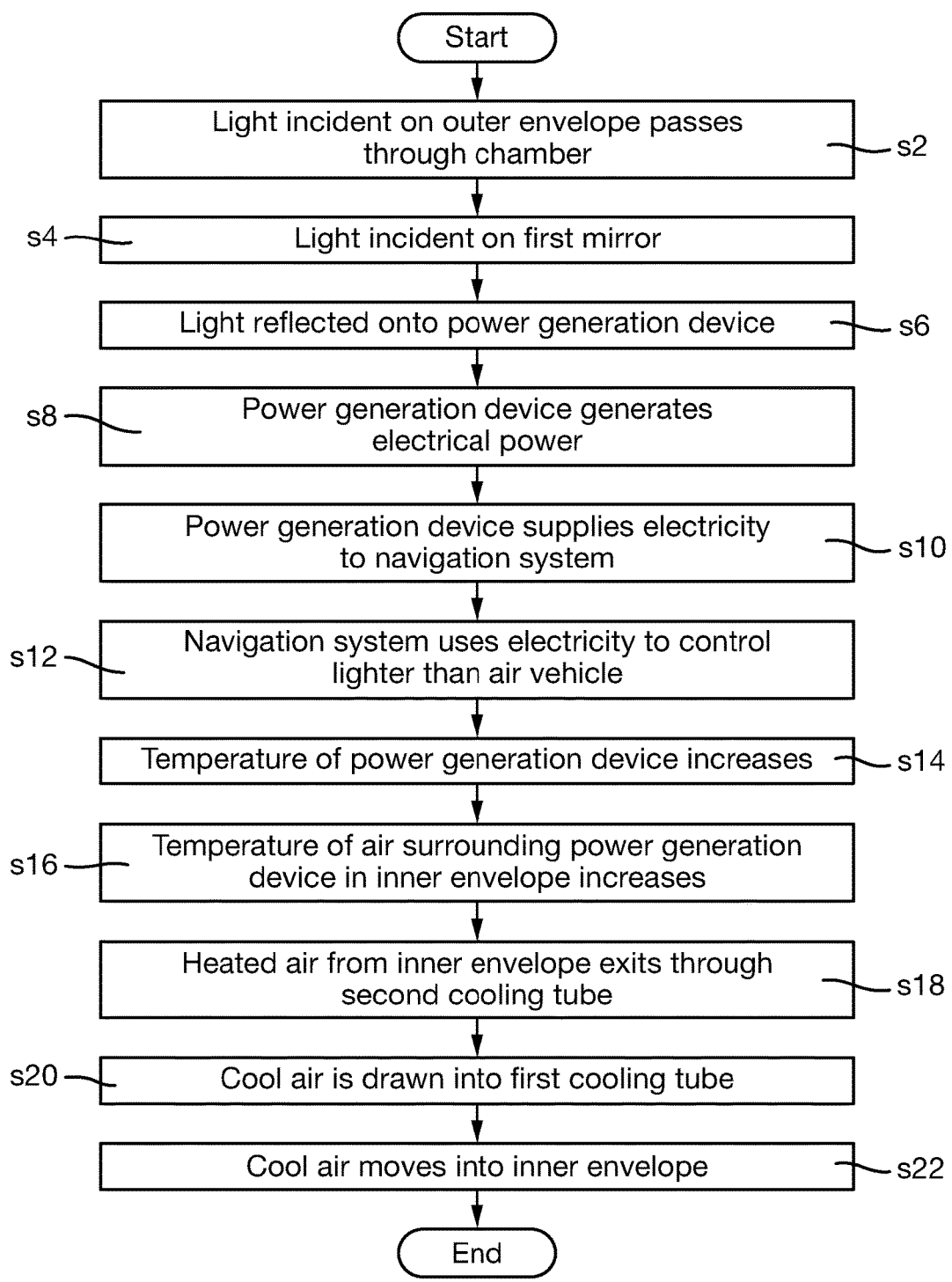

LIGHTER THAN AIR VEHICLE

RELATED APPLICATIONS

This application is a national phase application filed under 35 USC § 371 of PCT Application No. PCT/GB2016/052203 with an International filing date of Jul. 21, 2016, which claims priority of GB Patent Application 1513055.2 filed Jul. 24, 2015 and EP Patent Application 15275177.2 filed Jul. 24, 2015. Each of these applications is herein incorporated by reference in its entirety for all purposes.

FIELD OF THE INVENTION

The present invention relates to lighter than air vehicles.

BACKGROUND

Unlike aircraft that fly using the principles of dynamic lift, lighter than air vehicles, or "aerostats", use lighter than air gases for buoyancy.

Lighter than air vehicles tend to be capable of maintaining altitude for long periods because no, or little, fuel is expended to maintain lift. However, the time that they can spend airborne is limited.

Lighter than air vehicles are typically situated from 300 m to 30 km altitude.

Lighter than air vehicles are used for a wide variety of applications, such as telecommunications, positioning, and observation applications. Example applications for lighter than air vehicles include the provision of high speed internet, e-mail, telephony, televisual services, backhaul services, video-on-demand, global positioning, astronomical observations, atmospheric monitoring, and aerial photography.

SUMMARY OF THE INVENTION

In a first aspect, the present invention provides a lighter than air vehicle comprising an envelope containing a lighter than air gas, at least part of the envelope being configured to allow light to pass through it, i.e. to admit the passage of light; and means for selectively redirecting the light which passes through the at least part of the envelope. The at least part of the envelope may, for example, be transparent or translucent. The terminology "redirecting the light" is used herein to refer to directing light to a new or different place or purpose, and may include, but is not limited to, changing the direction or path of the light, or changing objects onto which the light is incident without changing the direction of the light.

The lighter than air vehicle may further comprise a plurality of devices for receiving, and using, the light. The directing device for selectively redirecting the light may be for selectively redirecting the light onto a selected device.

The directing device for selectively redirecting the light may be configured to operate in either a first mode of operation or a second mode of operation. The directing device for selectively redirecting the light may be configured to be changed from operating in its first mode of operation to operating in its second mode of operation. The directing device for selectively redirecting the light may be configured to, when operating in its first mode of operation, direct the light onto a first device of the plurality of devices (and not onto a second device of the plurality of devices, the second device being a different device to the first device). The directing device for selectively redirecting the light may be configured to, when operating in its second mode of operation, direct the light onto the second device of the plurality of devices (and not onto the first device of the plurality of devices).

The lighter than air vehicle may further comprise a housing coupled to the envelope and external to the envelope. One or more of the devices may be located in the housing.

The directing device for selectively redirecting the light may comprise a mirror disposed on a surface of the envelope. The mirror may be a concave mirror. The directing device for selectively redirecting the light may further comprises a further mirror located at or proximate to a focal point of the mirror, the further mirror being moveable with respect to the mirror.

The mirror may be a deformable mirror. The directing device for selectively redirecting the light further may comprises a deforming actuator for deforming the mirror. The deforming actuator for deforming the mirror may comprise a plurality of selectively inflatable pouches coupled between the mirror and the envelope. The inflatable pouches may be inflatable independently of one another.

The directing device for selectively redirecting the light may comprise an actuator for selectively moving a device into a path of the light. The actuator for selectively moving a device into a path of the light may comprise a switching actuator configured to switch the positions of two or more devices.

The lighter than air vehicle may further comprise a further envelope located inside the envelope, and a tube connecting the envelope to the further envelope. The first envelope and the second envelope may be spaced apart so as to define a chamber between the first envelope and the second envelope. The chamber may be filled with a lighter than air gas. A first opening of the tube may be located at an external surface of the envelope. A second opening of the tube may be located at an internal surface of the further envelope, the second opening of the tube being at an opposite end of the tube to the first opening of the tube.

One or more of the devices may be located within the further envelope.

The lighter than air vehicle may further comprise one or more further tubes, each further tube connecting the envelope to the further envelope. For each further tube, a first opening of that further tube may be located at an external surface of the envelope. For each further tube, a second opening of that further tube may be located at an internal surface of the further envelope, the second opening of that further tube being at an opposite end of that further tube to the first opening of that further tube.

The lighter than air vehicle may further comprise one or more valves located in each tube.

In a further aspect, the present invention provides a system comprising a lighter than air vehicle according to any of the preceding aspects, and an aircraft (for example, an unmanned aircraft) remote from the lighter than air vehicle. The directing device for selectively redirecting the light is configured to direct the light from the lighter than air vehicle onto the aircraft.

The system may further include one or more sensors configured to measure the relative positions of the lighter than air vehicle and the aircraft. Sensor measurements may be used to selectively redirect the light from the lighter than air vehicle onto the aircraft. The one or more sensors may be located on the lighter than air vehicle and the aircraft.

The system may further include transceivers and receivers for sending positional information between the lighter than air vehicle and the aircraft. This positional information may specify a position of the lighter than air vehicle and/or the aircraft. This positional information may be used to selectively redirect the light from the lighter than air vehicle onto the aircraft. The transmitters and receivers may be located on the lighter than air vehicle and the aircraft. The positional information may be measured by position measurement devices, which may be located on the lighter than air vehicle and/or the aircraft.

The directing device for selectively redirecting the light may be configured to focus the light onto the aircraft.

The aircraft may comprise one or more devices configured to use the light reflected by the lighter than air vehicle. For example, the aircraft may include one or more solar panels (or other power generation device) which may use light from the lighter than air vehicle to generate electrical power. This electrical power may be used or stored by the aircraft.

BRIEF DESCRIPTION OF THE DRAWINGS

FIG. 4 is a process flow-chart showing certain steps of method of operation of the lighter than air vehicle;

DETAILED DESCRIPTION

Figure 1:
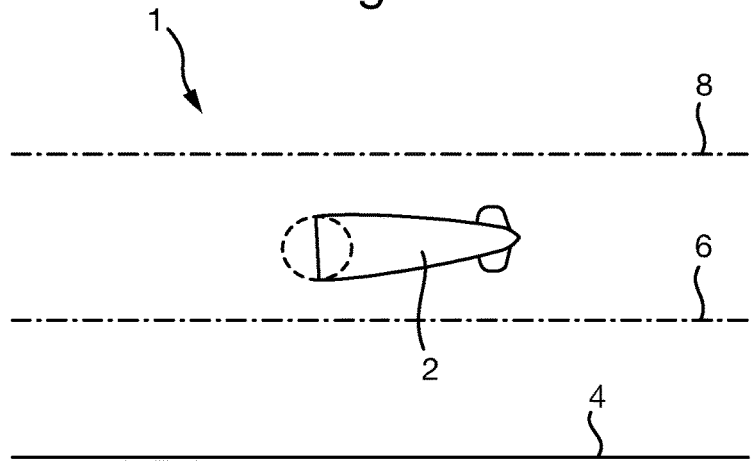
FIG. 1 is a schematic illustration (not to scale) showing a lighter than air vehicle.

FIG. 1 is a schematic illustration (not to scale) of a scenario 1 in which an embodiment of a lighter than air vehicle 2 (i.e. an aerostat) operates. Herein, the terminology "aerostat" or "lighter than air vehicle" refers to an aircraft that gains its lift through the use of a buoyant gas, i.e. an aircraft that remains aloft primarily using aerostatic buoyancy. Examples of lighter than air vehicles include but are not limited to airships and dirigibles. An "airship" is an aerostat than can navigate through the air under its own power. In this embodiment, the lighter than air vehicle 2 is unmanned.

In the scenario 1, the lighter than air vehicle 2 flies over an area of terrain 4. The lighter than air vehicle 2 operates at an altitude between a first altitude 6 and a second altitude 8. In this embodiment, the first altitude 6 is 17 km. Also, the second altitude 8 is 22 km.

Figure 2:
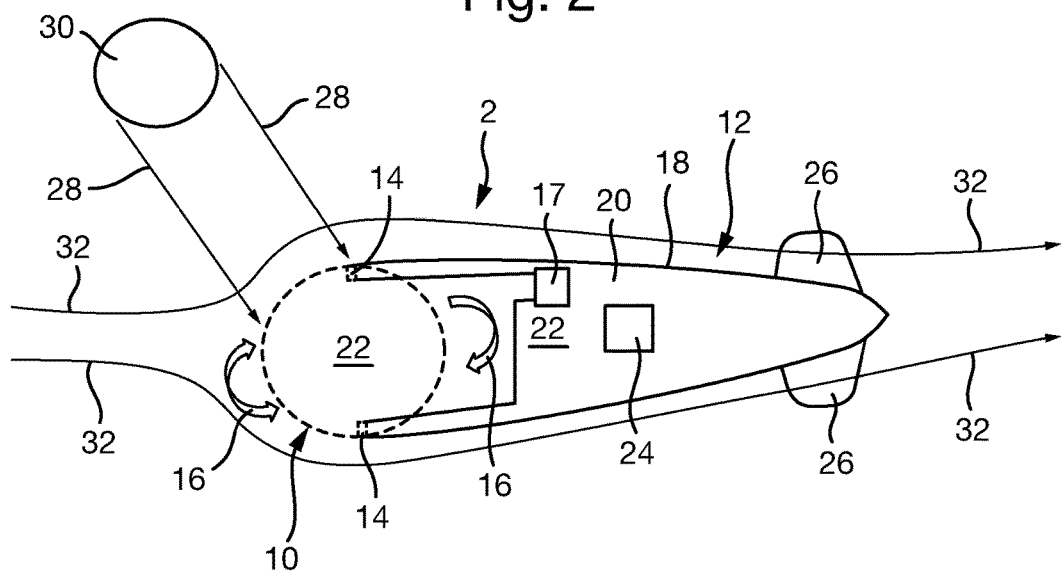
FIG. 2 is a schematic illustration (not to scale) showing further details of the lighter than air vehicle.

FIG. 2 is a schematic illustration (not to scale) showing further details of the lighter than air vehicle 2.

In this embodiment, the lighter than air vehicle 2 comprises a front portion 10 and a rear portion 12. The front portion 10 is mounted to a front end of the rear portion 12. The front portion 10 is mounted to the rear portion 12 via a first coupling device 14.

The first coupling device 14 comprises one or more gimbals. In addition to these one or more gimbals, the first coupling device 14 may comprise clamps or other attachment means. The first coupling device 14 is configured to allow rotation of the front portion 10 with respect to the rear portion 12. Such rotation is indicated in FIG. 1 by a double headed arrow and the reference number 16. The rotation of the front portion 10 with respect to the rear portion 12 is controlled by a controller 17 located in the rear portion 12. In this embodiment, the front portion 10 is configured to rotate with respect to the rear portion 12 about three mutually orthogonal axes. Preferably, the front portion 10 is configured to rotate with respect to the rear portion 12 about at least two mutually orthogonal axes.

The front portion 10 will be described in more detail later below with reference to FIG. 3.

In this embodiment the rear portion 12 of the lighter than air vehicle 2 comprises the controller 17, an elongate body portion 18, a first chamber 20 within the body portion 18, a lighter than air gas 22, a navigation system 24, and two fins 26.

In this embodiment, the body portion 18 is substantially cigar shaped. The body portion 18 defines the first chamber 20. The first chamber 20 is filled with the lighter than air gas 22. The lighter than air gas 22 is helium.

The body portion 18 comprises a front end and rear end. The front end is coupled to the front portion 10.

In this embodiment, the body portion 18 is made of a lightweight, rigid, transparent material, for example, a transparent plastic.

The fins 26 are attached to the body portion 18 at or proximate to the rear end of the body portion 18. The two fins 26 tend to stabilise the lighter than air vehicle 2 in flight and additionally can be used as flight control surfaces.

The navigation system 24 is housed within the first chamber 20.

In this embodiment, the navigation system 24 controls the lighter than air vehicle 2 to face into prevailing winds 32. For example, the navigation system 24 may control a propulsion system on board the lighter than air vehicle 2 to steer the lighter than air vehicle 2. This tends to reduce aerodynamic drag on the lighter than air vehicle 2 and may be performed so as to keep the lighter than air vehicle 2 substantially stationary in relation to the terrain 4.

In this embodiment, light 28 from the Sun 30 is incident on the front portion 10 enabling power to be provided by the front portion 10 to the controller 17 and navigation system 24. Generation of power by the front portion 10 using incident light 28 is described in more detail later below with reference to FIGS. 3 and 4.

Figure 3:
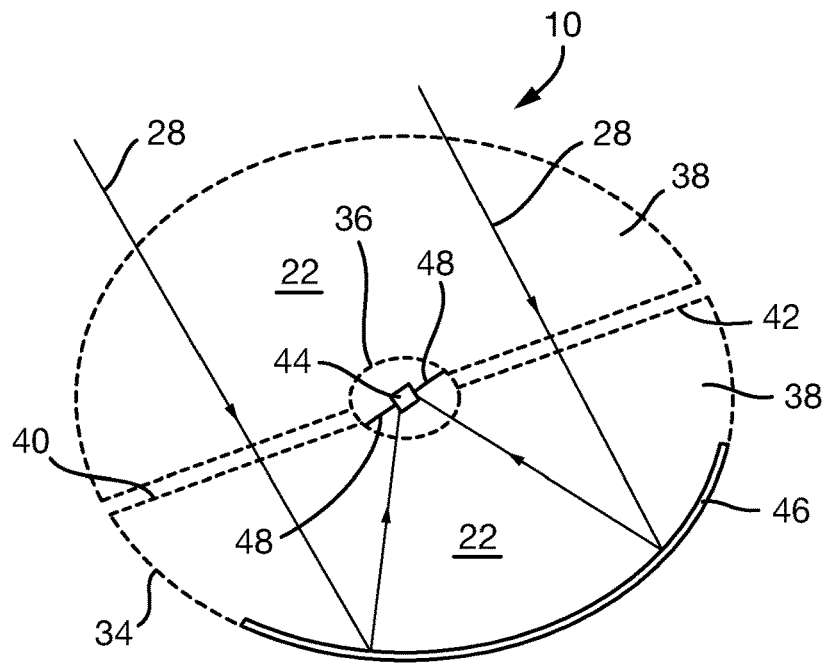
FIG. 3 is a schematic illustration (not to scale) showing a cross section of a front portion of the lighter than air vehicle.

FIG. 3 is a schematic illustration (not to scale) of a cross section of a first embodiment of the front portion 10.

In this embodiment, the front portion 10 comprises two envelopes (hereinafter referred to as the "outer envelope" and the "inner envelope" and indicated in the Figures by the reference numerals 34 and 36 respectively), a second chamber 38, the lighter than air gas 22, a plurality of cooling tubes (hereinafter referred to as a first cooling tube 40 and a second cooling tube 42), a power generation device 44 and a first mirror 46.

In this embodiment the outer envelope 34 is substantially spherical. The outer envelope 34 is made of a light-weight, gas tight, transparent material which could be a plastic. In this embodiment, the inner envelope 36 is contained within the outer envelope 34.

The inner envelope 36 is substantially spherical. The inner envelope 36 is located within the outer envelope 34 at or proximate to the centre of the outer envelope 34. This tends to facilitate focusing of the incident light 28 into the inner envelope 36. The diameter of the inner envelope 36 is smaller than the diameter of the outer envelope 34. In this embodiment, the inner envelope 36 is filled with air. The inner envelope 36 is made of a transparent, gas tight material which could be a plastic. The inner envelope 36 and the outer envelope 34 are coupled together by the first cooling tube 40 and the second cooling tube 42.

The inner envelope 36 and outer envelope 34 are spaced apart, thereby defining the second chamber 38 between the inner envelope 36 and the outer envelope 34.

The first cooling tube 40 extends through the second chamber 38 from the outer envelope 34 to the inner envelope 36.

The second chamber 38 is filled with the lighter than air gas 22.

A first end of the first cooling tube 40 has an opening located at the outer surface of the outer envelope 34. A second end of the first cooling tube 40 (which is opposite to the first end of the first cooling tube 40) has an opening located at the inner surface of the inner envelope 36. The first end of the first cooling tube 40 is open to an external environment, i.e. the first end of the first cooling tube 40 is in fluid communication with the external environment. Thus, air from outside the lighter than air vehicle 2 may flow from the external environment to the inside of the inner envelope 36 via the first cooling tube 40, and vice versa.

The second cooling tube 42 extends through the second chamber 38 from the outer envelope 34 to the inner envelope 36.

A first end of the second cooling tube 42 has an opening located at the outer surface of the outer envelope 34. A second end of the second cooling tube 42 (which is opposite to the first end of the second cooling tube 42) has an opening located at the inner surface of the inner envelope 36. The first end of the second cooling tube 42 is open to the external environment, i.e. the first end of the second cooling tube 42 is in fluid communication with the external environment. Thus, air from outside the lighter than air vehicle 2 may flow from the external environment to the inside of the inner envelope 36 via the second cooling tube 42, and vice versa to thereby allow cooling of the air within the inner envelope 36, which may contain heat generating apparatus, such as a power supply, sensor or electrical equipment, so as to inhibit heating of the lighter than air gas 22 within the outer envelope 34 with heat generated within the inner envelope 36.

The first cooling tube 40 and the second cooling tube 42 are made of a transparent, gas tight material which could be a plastic. In this embodiment, the first cooling tube 40 and the second cooling tube 42 are substantially cylindrical. However, in other embodiments, one or more of the cooling tubes may be a different appropriate shape.

The power generation device 44 is located within the inner envelope 36. Preferably, the power generation device 44 is located at or proximate to the centre of the inner envelope 36. The power generation device 44 is attached to the inner wall of the inner envelope 36 by the first coupling device 48.

The first coupling device 48 couples the power generation device 44 to the inner envelope 36 in such a way that the power generation device 44 has a fixed position relative to the first mirror 46. The power generation device 44 is configured to generate electrical power using light 28 incident on the power generation device 44. The power generation device 44 may comprise, for example, one or more solar panels.

The first mirror 46 is disposed on only a part of an internal surface of the outer envelope 34. Preferably, the first mirror 46 is disposed on a substantially hemispherical portion of the internal surface of the outer envelope 34. The first mirror 46 is concave. The power generation device 44 is located at or proximate to a focal point of the first mirror 46.

In this embodiment, the front portion 10 is rotatable relative to the rear portion 12 such that this first mirror 46 may be directed towards, or face, the Sun 30. In such an orientation, the light 28 passing through the outer envelope 34 is incident on the first mirror 46, as shown in FIG. 3, and the first mirror 46 reflects the incident light 28 onto the power generation device 44.

The first mirror 46 is made of a lightweight, flexible reflective material suitable for reflecting a range of electromagnetic waves such as a metal coated plastic.

FIG. 4 is a process flow-chart showing certain steps of an embodiment of a method of operation of the lighter than air vehicle 2.

At step s2, the light 28 from the Sun 30 is incident on the outer envelope 34. The light 28 passes through the transparent outer envelope 34, the second chamber 38 and the lighter than air gas 22.

At step s4, the light 28 is incident on the first mirror 46.

At step s6, the first mirror 46 reflects and focuses the incident light 28 onto the power generation device 44. The power generation device 44 is located at the focal point of the first mirror 46.

At step s8, the power generation device 44 generates electricity, using the light 28 reflected onto it by the first mirror 46.

At step s10, the power generation device 44 supplies electrical power to the navigation system 24. The power generation device 44 may also supply electrical power to the controller 17 or any other system on the air vehicle such as an energy storage device (e.g. a battery).

At step s12, the navigation system 24 uses the electrical power supplied by the power generation device 44 to control the lighter than air vehicle 2.

At step s14, the temperature of the power generation device 44 tends to increase. This increase in temperature tends to result from the power generation device 44 generating electricity from the incident light 28. Also, this increase in temperature may be as a result of the light 28 being focused onto the power generation device 44.

At step s16, the increase in temperature of the power generation device 44 tends to cause an increase in air temperature within the inner envelope 36.

At step s18, heated air from the inner envelope 36 moves from inside the inner envelope, through the second cooling tube 42 and out of the opening at the first end of the second cooling tube 42 to the external environment. This flow of air tends to result from the expansion of the heated air within the inner envelope 36.

At step s20, cool air from the external environment is drawn into the first cooling tube 40 through the opening at the first end of the first cooling tube 40. This drawing of cool air into the first cooling tube 40 tends to be effected by relatively hot air moving out of the inner envelope 36 via the second cooling tube 42.

In some embodiments, fans within one or more of the cooling tubes are implemented to facilitate movement of hot air from the inner envelope 36 through one or more of the cooling tubes to the atmosphere. The fans may also draw air into the inner envelope 36 via a cooling tube from the exterior of the vehicle. The fans may be powered by the power generation device 44.

At step s22, cool air moves through the first cooling tube 40 and into the inner envelope 36.

The flow of air through the first cooling tube 40, through the inner envelope 36, and out through the second cooling tube 42 tends to cool the power generation device 44.

The first cooling tube 40 allows for the flow of cool air into the inner envelope 36 from the external environment. The second cooling tube 42 allows for the flow of warm air out of the inner envelope 36 to the external environment. The flow of cool air through the first cooling tube 40 and into the inner envelope 36 tends to cause cool air to flow over the power generation device 44. This airflow tends to cool the power generation device 44. The cooling of the power generation device 44 tends to prevent the overheating of power generation device 44. This tends to enable the power generation device 44 to operate for longer periods of time, also, the life of the power generation device 44 tends to be extended. Furthermore, the cooling of the power generation device 44 tends to improve the efficiency with which electrical power is generated.

Furthermore, the cooling of the power generation device 44 tends to prevent unwanted heating and expansion of the lighter than air gas 22 in the second chamber 38. This tends to mitigate, at least to some extent, a need for a complex system to manage the pressure of the lighter than air gas 22. Also, this tends to mitigate unwanted lift and pressure on the envelope as a result of focusing the light 28 onto the power generation device 44.

Figure 5:
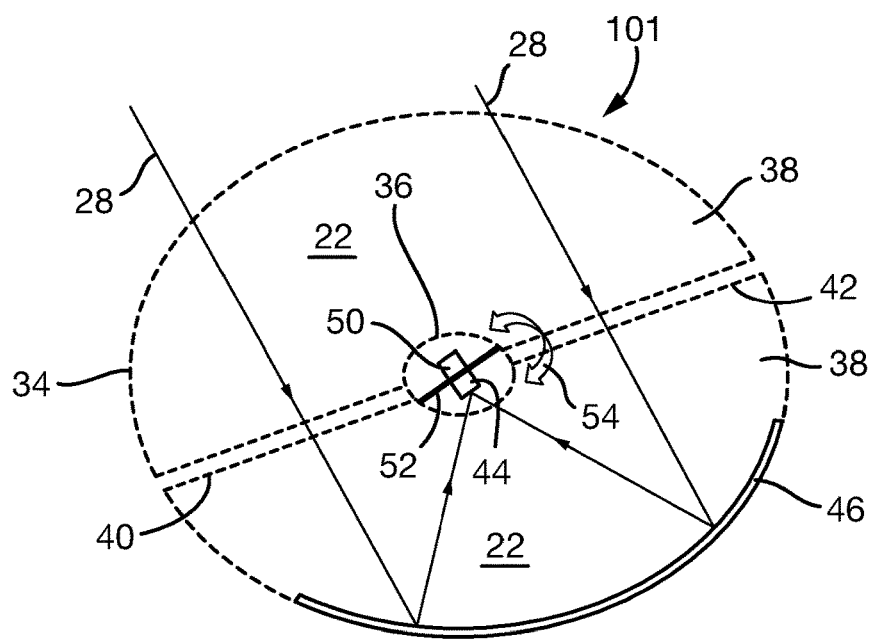
FIG. 5 is a schematic illustration (not to scale) showing a cross section of a further embodiment of the front portion.

FIG. 5 is a schematic illustration (not to scale) of a second embodiment of a front portion of the lighter than air vehicle 2, hereinafter referred to as "the further front portion" and indicated in the Figures by the reference numeral 101.

In this embodiment, the further front portion 101 comprises the outer envelope 34, the second chamber 38, the first cooling tube 40, the second cooling tube 42, the lighter than air gas 22, the power generation device 44 and the first mirror 46, coupled together as described in more detail above with reference to FIG. 3.

The further front portion 101 further comprises a camera 50 and a second coupling device 52.

In this embodiment, the camera 50 and second coupling device 52 are located proximate to the centre of the inner envelope 36.

In this embodiment, the power generation device 44 and the camera 50 are coupled together via the second coupling device 52. The second coupling device 52 couples the power generation device 44 and the camera 50 to the inner envelope 36.

The second coupling device 52 comprises one or more gimbals. The second coupling device 52 may further comprise clamps or other attachment means. The second coupling device 52 is operable to switch the positions of the power generation device 44 and the camera 50. In other words, the second coupling device 52 may move the power generation device 44 to the location of the camera 50 and, simultaneously, move the camera 50 to the location of the power generation device 44. Such switching or swapping is indicated in FIG. 5 by a double headed arrow and the reference number 54.

In other words, the second coupling device 52 has two different modes of operation, namely a first mode and a second mode. The second coupling device 52 is operable to switch between the two modes, i.e. from the first mode to the second mode and from the second mode to the first mode. Switching of the second coupling device 52 between its modes of operation may be controlled by any appropriate controller, for example the controller 17.

In its first mode of operation, the second coupling device 52 locates the power generation device 44 at the focal point of the first mirror 46. When the power generation device 44 is located at the focal point of the first mirror 46, the power generation device 44 generates electricity as described in more detail earlier above with reference to FIG. 3.

In its second mode of operation, the second coupling device 52 locates the camera 50 at the focal point of the first mirror 46. When the camera 50 is located at the focal point of the first mirror 46, the camera 50 captures images of objects from which the light is received.

For example, in some embodiments, when the camera 50 is located at the focal point of the first mirror 46, the first coupling device 14 may position the further front portion 101 with respect to the rear portion 12 such that the further front portion 101 is orientated so the first mirror 46 faces the terrain 4. Light reflected from the terrain 4 is incident on the first mirror 46 which reflects the light on to the camera 50. The camera 50 captures images of the terrain 4.

The camera 50 may be powered by the power generation device 44. The second coupling device 52 may also be powered by the power generation device 44. The power generation device 44 may supply power to the controller 17.

In this embodiment, the camera 50 is a visible light detecting camera. However, in other embodiments, the camera is a different light sensor, for example an ultraviolet (UV) camera, an infrared (IR) camera. Additionally in other embodiments, there may be any number of devices which could be used at the focal point of the first mirror 46 and interchanged as required by the first coupling device 48. This may include but not limited to a hydrogen gas generation device which may use the light focused by the first mirror 46 to split water into hydrogen and oxygen which could be used to maintain gas pressure within the first envelope 38 for a significant length of time.

In this embodiment, the first and second cooling tubes 40 and 42 provide cooling of the power generation device 44 and the camera 50 in a similar fashion to as described above for the first embodiment.

Figure 7:
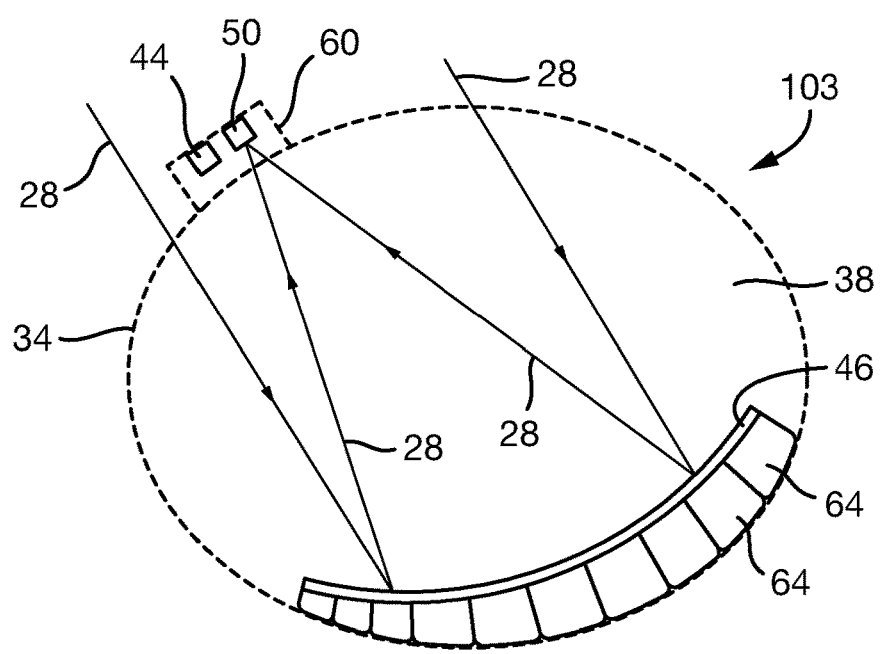
FIG. 7 is a schematic illustration (not to scale) showing a cross section of a further embodiment of the front portion.
Figure 8:
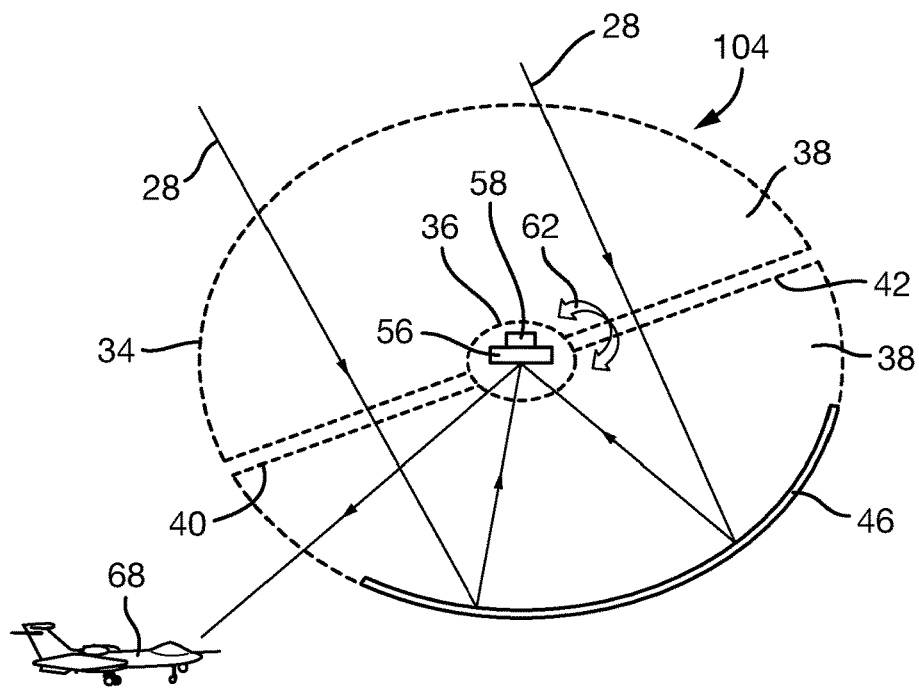
FIG. 8 is a schematic illustration (not to scale) showing a cross section of a further embodiment of the front portion.

In this embodiment, selecting which device light is focused onto is provided by switching the respective positions of those devices (i.e. the power generation device 44 and the camera 50). However, in other embodiments, selecting which device light is focused onto is provided in a different appropriate way, i.e. without switching the positions of the power generation device 44 and the camera 50. What will now be described in respect to FIGS. 6 to 8 are further embodiments in which light is selectively focused onto a selected device.

Figure 6:
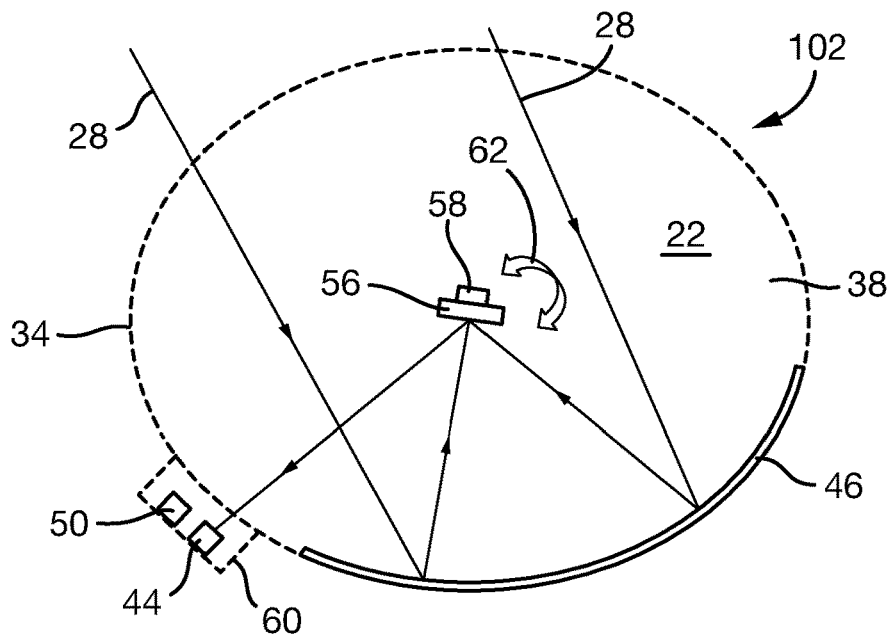
FIG. 6 is a schematic illustration (not to scale) showing a cross section of a further embodiment of the front portion.

FIG. 6 is a schematic illustration (not to scale) of a third embodiment of a front portion of the lighter than air vehicle 2, hereinafter referred to as the "second further front portion" and indicated in the Figures by the reference numeral 102.

In this embodiment, the second further front portion 102 comprises the outer envelope 34, the lighter than air gas 22, the second chamber 38 and the first mirror 46 coupled together as described in more detail above with reference to FIG. 3. The second further front portion 102 further comprises a second mirror 56, a third coupling device 58, and a housing 60.

Although, for ease of depiction, the cooling tubes are not shown in FIG. 6, they may nevertheless optionally be included to provide cooling to, for example, the second mirror 56, as described in more detail earlier above with reference to FIGS. 3 to 5.

The housing 60 is made of a transparent plastic material. In this embodiment, the housing 60 is filled with air. The housing 60 is attached to the external surface of the outer envelope 34. In this embodiment the housing 60 is closed to the external atmosphere. However, in other embodiments, the housing 60 comprises one or more openings to the external environment to allow air to flow into the housing 60, thereby cooling the devices located within the housing 60. The power generation device 44 and the camera 50 are located in the housing 60.

The second mirror 56 is located at or proximate to the focal point of the first mirror 46. The second mirror 56 is coupled to the inner surface of the outer envelope 34 via the third coupling device 58. The third coupling device 58 comprises one or more gimbals. The third coupling device 58 may further comprise clamps or other attachment means. The third coupling device 58 is operable to rotate the second mirror 56 such that the orientation of the second mirror 56 in relation to the first mirror 46 can be changed. The rotation of the second mirror 56 by the third coupling device 58 may be controlled by any appropriate controller, for example the controller 17. Rotation of the second mirror 56 by the third coupling device 58 is indicated in FIG. 6 by a double headed arrow and the reference number 62.

In this embodiment, the third coupling device 58 has two different modes of operation, namely a first mode and a second mode. The third coupling device 58 is operable to switch between the two modes, i.e. from the first mode to the second mode and from the second mode to the first mode. Switching of the third coupling device 58 between its modes of operation may be controlled by any appropriate controller, for example the controller 17.

In its first mode of operation, the third coupling device 58 rotates the second mirror 56 such that the second mirror 56 reflects light received from the first mirror 46 onto the power generation device 44. When light is selectively reflected onto the power generation device 44 by the second mirror 56, the power generation device 44 generates electricity as described in more detail earlier above with reference to FIG. 3.

In its second mode of operation, the third coupling device 58 rotates the second mirror 56 such that the second mirror 56 reflects light received from the first mirror 46 onto the camera 50. When light is selectively reflected onto the camera 50, the camera 50 captures images of objects from which the light is received. For example, in some embodiments, when the third coupling device 58 selectively reflects light onto the camera 50, the first coupling device 14 may position the second further front portion 102 with respect to the rear portion 12 such that the second further front portion 102 is orientated so the first mirror 46 faces the terrain 4. The light reflected from the terrain 4 is incident on the first mirror 46 which reflects the light on to the second mirror 56, which selectively reflects light onto the camera 50. The camera 50 captures images of the terrain 4.

An advantage provided by the second further front portion 102 is that a likelihood of over-heating of the power generation device 44 and/or the camera 50 tends to be reduced. For example, the housing may be open to the external environment. Furthermore, the light incident on the second mirror 56 tends to be reflected out of the second chamber 38 into the housing 60. This tends to prevent the unwanted heating of lighter than air gas 22.

Another advantage of the housing 60 being located at the external surface of the outer envelope 34 is that the power generation device 44 and the camera 50 tend to be easily accessible. This tends to enable the easy replacement or repair of the power generation device 44 or the camera 50.

What will now be described is a further way in which light may be selectively focused or reflected onto a device.

FIG. 7 is a schematic illustration (not to scale) of a fourth embodiment of a front portion of the lighter than air vehicle 2, hereinafter referred to as the "third further front portion" and indicated in the Figures by the reference numeral 103.

In this embodiment, the third further front portion 103 comprises the outer envelope 34, the lighter than air gas 22, the second chamber 38, the power generation device 44, the camera 50, and the housing 60, which are coupled together as described in more detail above with reference to FIG. 6.

In this embodiment, the first mirror 46 is coupled to the internal surface of the outer envelope 34 via a plurality of inflatable gas pouches 64.

In this embodiment, the gas pouches 64 are made of a flexible, gas tight material such as a plastic. Each gas pouch 64 may be independently inflated with a gas by a pump (not shown in the Figures). The gas may be, for example, air from the external environment or a lighter than air gas. The pump may be controlled by, for example, the controller 17. Each gas pouch 64 may be independently deflated by the pump.

In this embodiment, the first mirror 46 is made of a flexible material such that the first mirror 46 is deformable by selective inflation and deflation of the gas pouches 64.

In this embodiment, the gas pouches 64 have two different configurations or modes, namely a first configuration and a second configuration. The gas pouches 64 may be selectively inflated or deflated to change the configuration of the gas pouches 64 between the two configurations, i.e., from the first configuration to the second configuration and from the second configuration to the first configuration. Changing of the gas pouches 64 between their configurations may be controlled by any appropriate controller, for example the controller 17.

In their first configuration, the gas pouches 64 define the shape of the first mirror 46 such that the first mirror 46 selectively reflects light 28 onto the power generation device 44. When light is selectively reflected onto the power generation device 44 by the first mirror 46, the power generation device 44 generates electricity as described in more detail earlier above with reference to FIG. 3.

In their second configuration, the gas pouches 64 define the shape of the first mirror 46 such that the first mirror 46 selectively reflects light 28 onto the camera 50. When light is selectively reflected onto the camera 50, the camera 50 captures images of objects from which the light is received. For example, in some embodiments, when the gas pouches 64 deform the first mirror 46 such that the first mirror 46 selectively reflects light onto the camera 50, the first coupling device 14 may position the third further front portion 103 with respect to the rear portion 12 such that the third further front portion 103 is orientated so the first mirror 46 faces the terrain 4. The light reflected from the terrain 4 is incident on the first mirror 46 which selectively reflects light onto the camera 50. The camera 50 captures images of the terrain 4.

The power for operating the pump is supplied by the power generation device 44.

In addition to the advantages described in more detail above for the preceding embodiments, the above described deformation of the first mirror 46 tends to enable selectively focusing the sun light 28 onto the power generation device 44 or the camera 50.

Furthermore having a number of gas pouches 64 which can be inflated and deflated independently can allow the first mirror 66 to be shaped in such a way to adapt the way that the light 28 is reflected onto camera 50. This tends to enable the first mirror 66 to correct any distortions in light 28 which may result from turbulent atmosphere or other effects such that the light received at camera 50 has been corrected in order to generate a clear image.

What will now be described is a further embodiment in which light is selectively focused on an entity remote from the lighter than air vehicle 2.

FIG. 8 is a schematic illustration (not to scale) of a fifth embodiment of a front portion of the lighter than air vehicle 2, hereinafter referred to as the "fourth further front portion" and indicated in the Figures by the reference numeral 104.

In this embodiment, the fourth further front portion 104 comprises the outer envelope 34, the inner envelope 36, the lighter than air gas 22, the second chamber 38, the first cooling tube 40, the second cooling tube 42, the first mirror 46, the second mirror 56, and third coupling device 58, which are coupled together as described in more detail above with reference to FIG. 6.

In this embodiment, the first and second mirrors 46, 56 are configured to operate, as described in more detail earlier above with reference to FIG. 6, so as to reflect the incident light 28 onto an aircraft 68.

In this embodiment, the aircraft 68 is remote from the lighter than air vehicle 2. The aircraft 68 may include one or more solar panels located on its external surface for generating electrical power using the light 28 reflected onto the aircraft 68 by the lighter than air vehicle 2. In some embodiments, the lighter than air vehicle 2 may reflect light onto a different remote entity instead of or in addition to the aircraft 68, for example a ground-based solar panel.

The reflecting of light to the outside of the lighter than air vehicle 2 tends to reduce heating of the lighter than air gas within the lighter than air vehicle. Thus, unwanted expansion of the lighter than air gas tends to be avoided.

In some above embodiments, there are two cooling tubes, namely the first cooling tube 40 and second cooling tube 42. The cooling tubes 40, 42 are open at their respective ends. However, in other embodiments, the lighter than air vehicle 2 includes a different number of cooling tubes, for example, zero cooling tubes, only a single cooling tube, or more than two cooling tubes. In some embodiments, one or more of the cooling tubes may include one or more valves for controlling fluid flow through the cooling tube.

Figure 9:
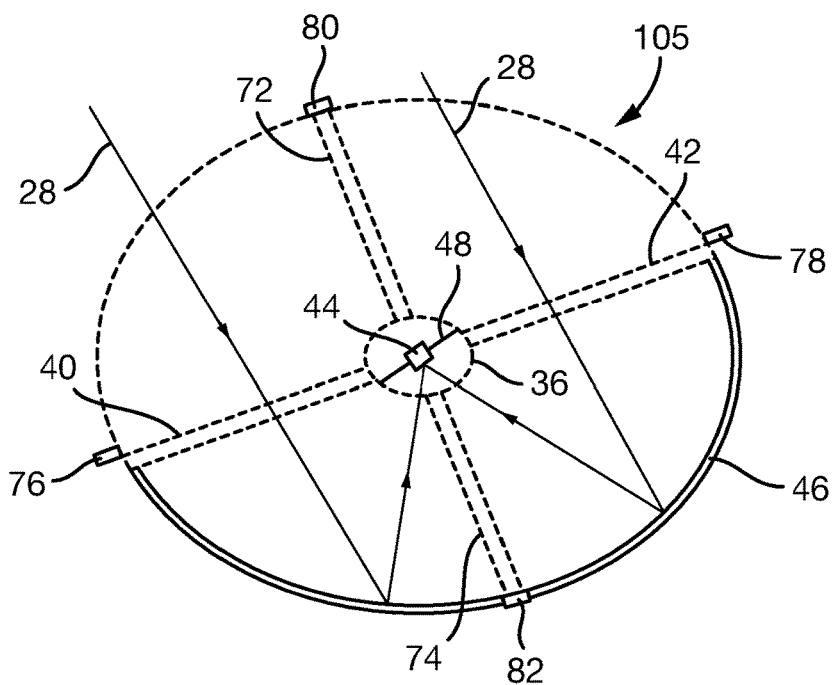
FIG. 9 is a schematic illustration (not to scale) showing a cross section of a further embodiment of the front portion.

FIG. 9 is a schematic illustration (not to scale) of a sixth embodiment of a front portion of the lighter than air vehicle 2, hereinafter referred to as the "fifth further front portion" and indicated in the Figures by the reference numeral 105.

In this embodiment, the fifth further front portion 105 comprises the outer envelope 34, the inner envelope 36, the lighter than air gas 22, the second chamber 38, the first cooling tube 40, the second cooling tube 42, the first mirror 46, the first coupling device 48, and the power generation device 44 which are coupled together as described in more detail above with reference to FIG. 3.

The fifth further front portion 105 further comprises two additional cooling tubes, hereinafter referred to as the third cooling tube 72 and the fourth cooling tube 74. Each of the first, second, third, and fourth cooling tubes 40, 42, 72, 74 includes a respective valve, hereinafter referred to as the first valve 76, the second valve 78, the third valve 80, and the fourth valve 82 respectively.

The third cooling tube 72 and the fourth cooling tube 74 are made of a transparent material such as plastic. In this embodiment, the third cooling tube 72 and the fourth cooling tube 74 are substantially cylindrical but could be any appropriate shape.

The third cooling tube 72 extends through the second chamber 38 from the outer envelope 34 to the inner envelope 36.

A first end of the third cooling tube 72 has an opening located at the outer surface of the outer envelope 34. A second end of the third cooling tube 72 (which is opposite to the first end of the third cooling tube 72) has an opening located at the inner surface of the inner envelope 36. The first end of the third cooling tube 72 is open to the external environment. Thus, air may flow between the outside of the lighter than air vehicle 2 and the inside of the inner envelope 36, via the third cooling tube 72.

The fourth cooling tube 74 extends through the second chamber 38 from the outer envelope 34 to the inner envelope 36.

A first end of the fourth cooling tube 74 has an opening located at the outer surface of the outer envelope 34. A second end of the fourth cooling tube 74 (which is opposite to the first end of the fourth cooling tube 74) has an opening located at the inner surface of the inner envelope 36. The first end of the fourth cooling tube 74 is open to the external environment. Thus, air may flow between the outside of the lighter than air vehicle 2 and the inside of the inner envelope 36, via the fourth cooling tube 74.

Preferably, the directions in which the cooling tubes 40, 42, 72, 74 point have components in three mutually orthogonal directions.

The first valve 76 is located at or proximate to the first end of the first cooling tube 40. The second valve 78 is located at or proximate to the first end of the second cooling tube 42. The third valve 80 is located at or proximate to the first end of the third cooling tube 72. The fourth valve 82 is located at or proximate to the first end of fourth cooling tube 74.

The valves 76, 78, 80, 82 are powered by the power generation device 44. The valves 76, 78, 80, 82 are controlled by the controller 17.

The valves 76, 78, 80, 82 are configured to open and close independently of each other.

By controlling operation of the valves 76, 78, 80, 82, air flow through the cooling tubes 40, 42, 72, 74 may be controlled. By controlling the air flow through the cooling tubes 40, 42, 72, 74, forces exerted on the lighter than air vehicle 2 may be controlled. Thus, steering and manoeuvring of the lighter than air vehicle 2 may be effected.

Preferably, the directions in which the cooling tubes 40, 42, 72, 74 point have components in three mutually orthogonal directions to enable propulsive force in all directions. Within FIG. 9, four cooling tubes are shown however, a different number of cooling tubes, for example more than four, may be used.

In the above embodiments, the lighter than air vehicle is unmanned. However in other embodiments the lighter than air vehicle is manned.

In the above embodiments, the vehicle is an aerostat. However in other embodiments the vehicle is a different type of vehicle. Examples of aerostats include but are not limited to; tethered or moored balloons such as blimps, free flying buoyant aircraft such as dirigibles, free-flying buoyant aircraft that are propelled and steered such as airships, and hybrids, which use both static buoyancy and dynamic airflow to provide lift.

In the above embodiments, the first altitude is 17 km. Also, the second altitude 8 is 22 km. However in other embodiments the first altitude is a different altitude. In some embodiments, the second altitude is a different altitude. In some embodiments, the first altitude is the tropopause. In some embodiments, the second altitude is the stratopause.

In the above embodiments, the front portion is mounted to the front end of the rear portion via a first coupling device. However, in other embodiments, the front portion is mounted to the rear portion in a different way. The first coupling device is operable to rotate the front portion relative to the rear portion. However, in other embodiments, the front portion does not rotate. In some embodiments, the front portion is releasably connected to the rear portion. In some embodiments, the rear portion may be omitted.

In the above embodiments, the front portion is substantially spherical. However in other embodiments the front portion is a different shape other than spherical, such as ovoidal or cylindrical. The inner and outer envelopes of the front portion may be any appropriate shape.

In the above embodiments, the front portion and the rear portion are made of a transparent plastic such as polyethylene. In other embodiments the front portion and/or rear portion are made of a different material. Any appropriate lightweight, flexible, gas tight material could be used. Preferably, material permits the wavelength of electromagnetic energy used by the on-board instrumentation to pass through it.

In the above embodiments, the outer envelope and inner envelope are made of transparent plastic. However, in other embodiments, at least part of one or more of the envelopes is not transparent. For example, one or more of the envelopes may be translucent. Also, in some embodiments, only a part of an envelope is opaque.

Preferably, at least part of the outer envelope is pellucid. Preferably, at least part of the inner envelope is pellucid. The terminology "pellucid" is used herein to refer to a material which admits light to pass through it, for example is transparent or translucent.

In the above embodiments, the body portion of the rear portion of the lighter than air vehicle is substantially cigar shaped. In other embodiments, the body portion of the rear portion is a different shape.

In the above embodiments, the rear portion comprises a navigation system. However, in other embodiments, the front portion comprises the navigation system. In some embodiments, the navigation system is omitted. In some embodiments, the vehicle may comprise one or more different systems instead of or in addition to the navigation system. Examples of other appropriate systems include, but are not limited to; a propulsion system, a flight control system, landing gear, electrical systems, an avionics system, a fuel system, a communications system, a de-icing system, a cooling system, instrumentation and recording systems, a fire protection system, a power storage system.

In the above embodiments, the rear portion comprises fins. However in other embodiments, the vehicle does not include fins.

In the above embodiments, the power generation device comprises one or more solar panels. However, in other embodiments, the power generation device is a different type of power generation device that includes different power generation means instead of or in addition to solar panels.

In the above embodiments, the lighter than air gas is helium. In other embodiments, the lighter than air gas is a different gas. The terminology "lighter than air gas" is used herein to refer to a gas that has a lower density than air.

In the above embodiments, both the front portion and the rear portion contain the lighter than air gas. However, in other embodiments, one or the front portion or the rear portion does not contain lighter than air gas.

In the above embodiments, the inner envelope is located at or proximate to the centre of the outer envelope. However, in other embodiments, the inner envelope is located at a different location within the second envelope. In some embodiments, there are multiple inner envelopes.

In the above embodiments, the first cooling tube and the second cooling tube are made of a transparent plastic. However, in other embodiments, one or more of the cooling tubes is made of a different material, for example a translucent plastic.

In the above embodiments, the inner envelope is spherical. However, in other embodiments the inner envelope is a different shape, for example ovoidal, cylindrical or cuboidal.

In the above embodiments, the first cooling tube and second cooling tube are substantially parallel to each other. However, in other embodiments, the first cooling tube and the second cooling tube are oriented differently, i.e. the tubes may be oblique to each other. For example, in some embodiments, the first and second cooling tubes are perpendicular to each other.

In the above embodiments, the first mirror is disposed across a portion of the internal surface of the outer envelope. However, in other embodiments the first mirror is not disposed on the internal surface of the outer envelope. For example, the first mirror may be disposed on an outer surface of the outer envelope, or a surface of the inner envelope.

It should be noted that certain of the process steps depicted in the flowchart of FIG. 4 and described above may be omitted or such process steps may be performed in differing order to that presented above and shown in the FIG. 4. Furthermore, although all the process steps have, for convenience and ease of understanding, been depicted as discrete temporally-sequential steps, nevertheless some of the process steps may in fact be performed simultaneously or at least overlapping to some extent temporally.

In the above embodiments, the vehicle includes a power generation device and a camera. However, in other embodiments, the vehicle may include one or more different types of device instead of or in addition to the power generation device and/or the camera. For example, the vehicle may include a hydrogen gas generation system.

In certain of the above embodiments, the power generation device and/or the camera are located proximate to the centre of the inner envelope. However, in other embodiments, the power generation device and/or camera is located in a different position inside the inner envelope.

In the above embodiments, the coupling devices comprise one or more gimbals. However, in other embodiments, a coupling device comprise one or more cams, wheels or another suitable mechanism, instead of or in addition to the one or more gimbals.

In the above embodiments, the housing in which the power generation device and the camera are located is fixed to the outer envelope. However, in other embodiments, the housing, and the devices located therein, are movable with respect to the outer envelope.

In the above embodiments, the housing contains air. However in other embodiments, the housing contains a different type of gas, e.g. the lighter than air gas, or a vacuum.

In the above embodiments, the housing is located on the external surface of the outer envelope. However, in other embodiments, the housing is located in a different location, for example, on an internal surface of the outer envelope.

In certain above embodiments, the gas pouches are made of plastic. However, in other embodiments one or more gas pouches are made of a different appropriate material, for example, a plastic. In the above embodiment, the gas pouches are filled with air. However, in other embodiments the gas pouches are filled with a different fluid, such as the lighter than air gas or a liquid.

In certain above embodiments, the first mirror is a deformable mirror. However, in another embodiment, the functionality of the deformable mirror is provided in a different appropriate way. For example, the first mirror may include multiple separate mirrors, each of which may be attached to a respective gas pouch so that the mirrors may be moved with respect to one another by selectively inflating the gas pouches.

What is claimed is:

1. A lighter than air vehicle comprising:
   an envelope containing a lighter than air gas, at least part of the envelope admitting the passage of light therethrough;
   a plurality of devices for receiving the light;
   a directing device for selectively redirecting the light which passes through the at least part of the envelope; and
   the directing device for selectively redirecting the light being configured to operate in either a first mode of operation or a second mode of operation;
   the directing device for selectively redirecting the light being configured to be changed from operating in its first mode of operation to operating in its second mode of operation;
   the directing device for selectively redirecting the light being configured to, when operating in its first mode of operation, direct the light onto a first device of the plurality of devices for receiving light and not onto a second device of the plurality of devices for receiving light, the second device being a different device to the first device; and
   the directing device for selectively redirecting the light being configured to, when operating in its second mode of operation, direct the light onto the second device and not onto the first device.

2. The lighter than air vehicle according to claim 1, wherein:
   the lighter than air vehicle further comprises a housing coupled to the envelope and external to the envelope; and
   one or more of the devices are located in the housing.

3. The lighter than air vehicle according to claim 1, wherein the directing device for selectively redirecting the light comprises a mirror disposed on a surface of the envelope.

4. The lighter than air vehicle according to claim 3, wherein the mirror is a concave mirror.

5. The lighter than air vehicle according to claim 4, wherein the mirror is a deformable mirror, and the directing device for selectively redirecting the light further comprises a deforming actuator for deforming the mirror.

6. The lighter than air vehicle according to claim 5, wherein the deforming actuator for deforming the mirror comprises a plurality of selectively inflatable pouches coupled between the mirror and the envelope, the plurality of inflatable pouches being configured to be inflated independently of one another.

7. The lighter than air vehicle according to claim 3, wherein the directing device for selectively redirecting the light comprises a further mirror located at a focal point of the mirror, the further mirror being configured to move with respect to the mirror.

8. The lighter than air vehicle according to claim 1, wherein the directing device for selectively redirecting the light comprises means for moving one of the plurality of devices for receiving the light into a path of the light.

9. The lighter than air vehicle according to claim 8, wherein the means for moving a device into a path of the light comprises switching means configured to switch the positions of two or more of the plurality of devices for receiving the light.

10. The lighter than air vehicle according to claim 1, wherein:
    the lighter than air vehicle further comprises:
       a further envelope located inside the envelope; and
       a tube connecting the envelope to the further envelope; and wherein:
       the envelope and the further envelope are spaced apart so as to define a chamber between the envelope and the further envelope;
       a first opening of the tube is located at an external surface of the envelope; and
       a second opening of the tube is located at an internal surface of the further envelope, the second opening of the tube being at an opposite end of the tube to the first opening of the tube.

11. The lighter than air vehicle according to claim 10, wherein one or more of the devices for receiving the light are located within the further envelope.

* * * * *

UNITED STATES PATENT AND TRADEMARK OFFICE
CERTIFICATE OF CORRECTION

PATENT NO. : 10,193,008 B2  
APPLICATION NO. : 15/745802  
DATED : January 29, 2019  
INVENTOR(S) : Nicholas Giacomo Robert Colosimo, Julian David Wright and Andrew James Williams Page 1 of 1

It is certified that error appears in the above-identified patent and that said Letters Patent is hereby corrected as shown below:

On the Title Page

Filing date of item (30), Priority Application EP152751772 should be 7/24/2015 not 7/27/2015.

Signed and Sealed this  
Nineteenth Day of May, 2020

Andrei Iancu  
*Director of the United States Patent and Trademark Office*